United States Patent [19]

Burward-Hoy

[11] Patent Number: 5,543,662
[45] Date of Patent: Aug. 6, 1996

[54] LOW HEAT LOSS AND SECURE CHIP CARRIER FOR CRYOGENIC COOLING

[75] Inventor: Trevor Burward-Hoy, Cupertino, Calif.

[73] Assignee: Sun Microsystems, Inc., Mountain View, Calif.

[21] Appl. No.: 309,056

[22] Filed: Sep. 20, 1994

[51] Int. Cl.$^6$ .............................. H01L 23/34; H05K 7/20
[52] U.S. Cl. .................. 257/716; 257/712; 257/713; 257/718; 257/719; 361/704; 361/707
[58] Field of Search ..................................... 257/712, 713, 257/716, 718, 719; 361/688, 704, 707

[56] References Cited

U.S. PATENT DOCUMENTS 5,294,750  3/1994  Sakai et al. .............................. 257/712

Primary Examiner—Sara W. Crane
Assistant Examiner—Carl Whitehead, Jr.
Attorney, Agent, or Firm—Blakely Sokoloff Taylor & Zafman

[57] ABSTRACT

An integrated circuit package is disclosed. The integrated circuit package includes a substrate having a cavity formed therein for enclosing an integrated circuit. The integrated circuit package also includes a carrier for holding the integrated circuit. The carrier is positioned within the cavity of the substrate. A thermally reactive connector is coupled to the carrier. The thermally reactive connector is for selectively coupling the carrier to the substrate when a temperature of the thermally reactive connector is above a first temperature such that the carrier is held in position within the opening. The thermally reactive connector is also for decoupling the carrier from the substrate when the carrier temperature is at the first temperature. In this manner, the number of thermal paths between the integrated circuit and the substrate of the integrated circuit is reduced.

13 Claims, 5 Drawing Sheets

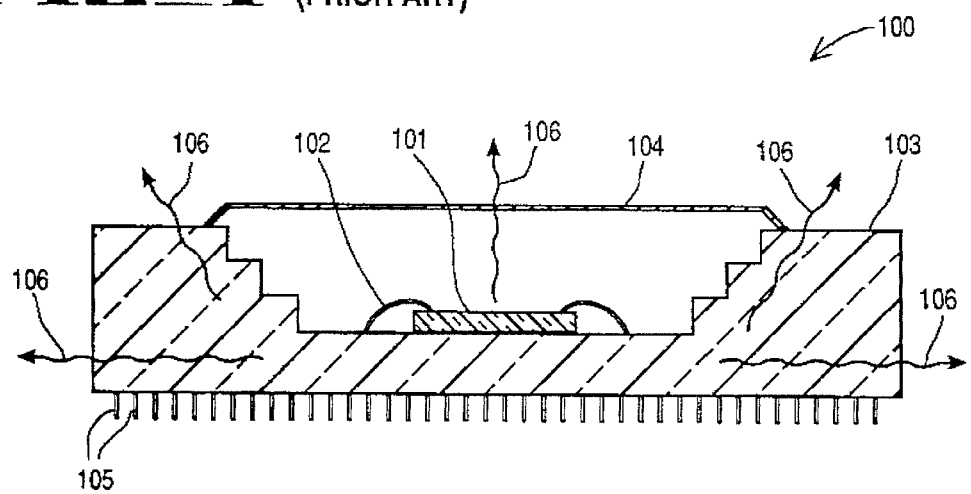
FIG_1 (PRIOR ART)
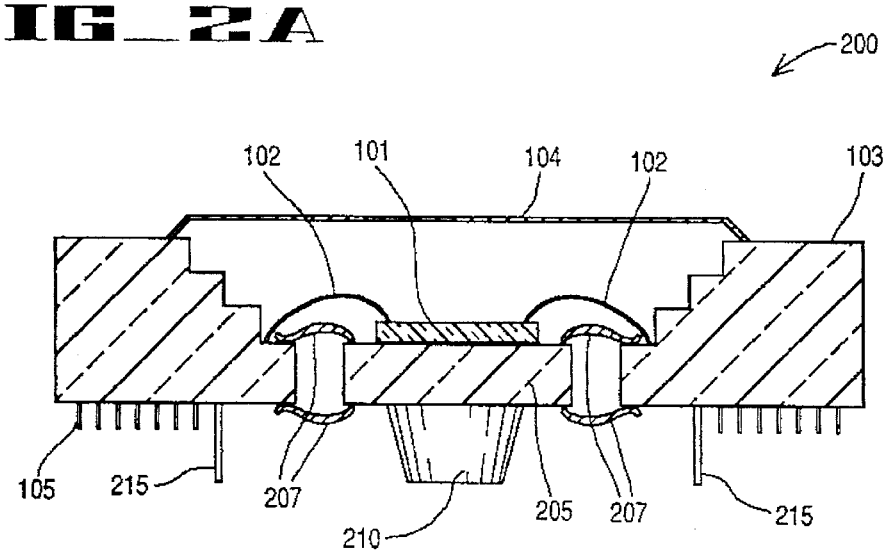
FIG_2A
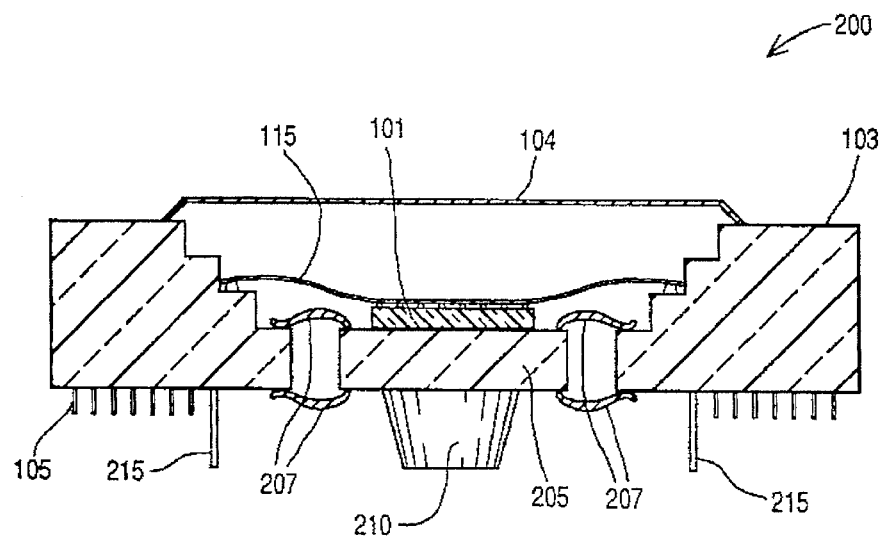
FIG_2B

FIG_3A
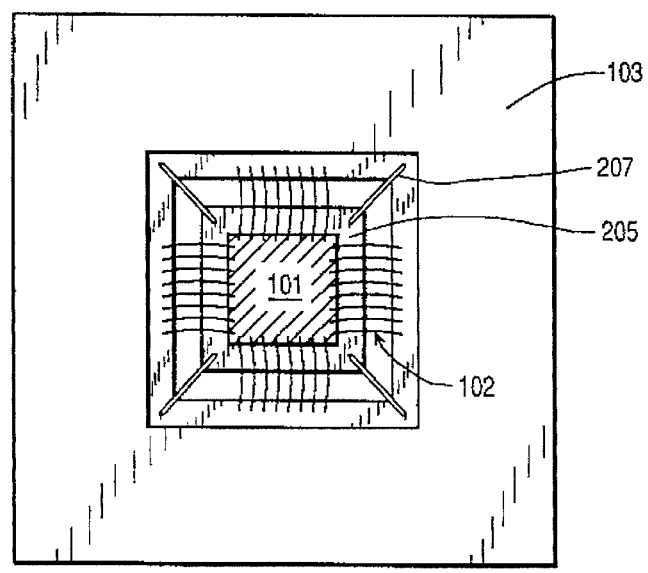
FIG_3B
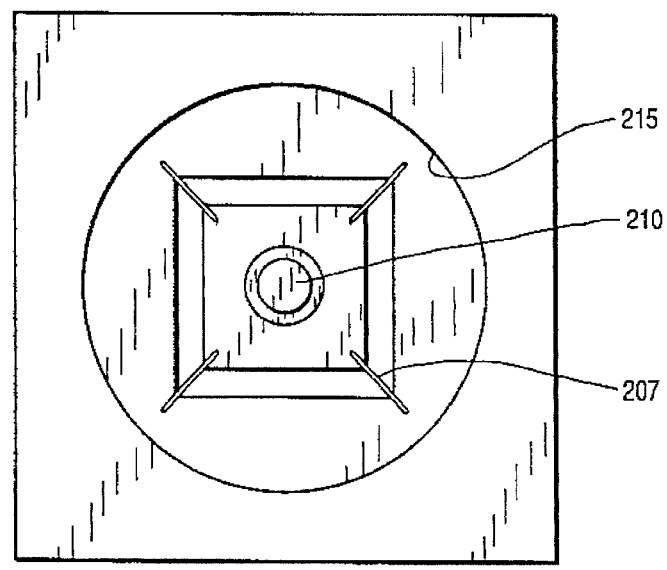
FIG_4
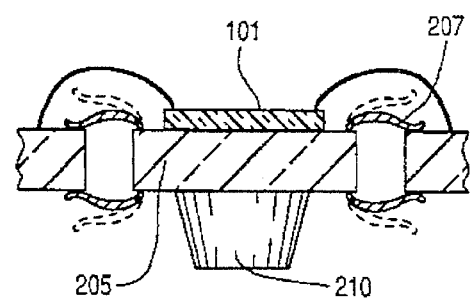

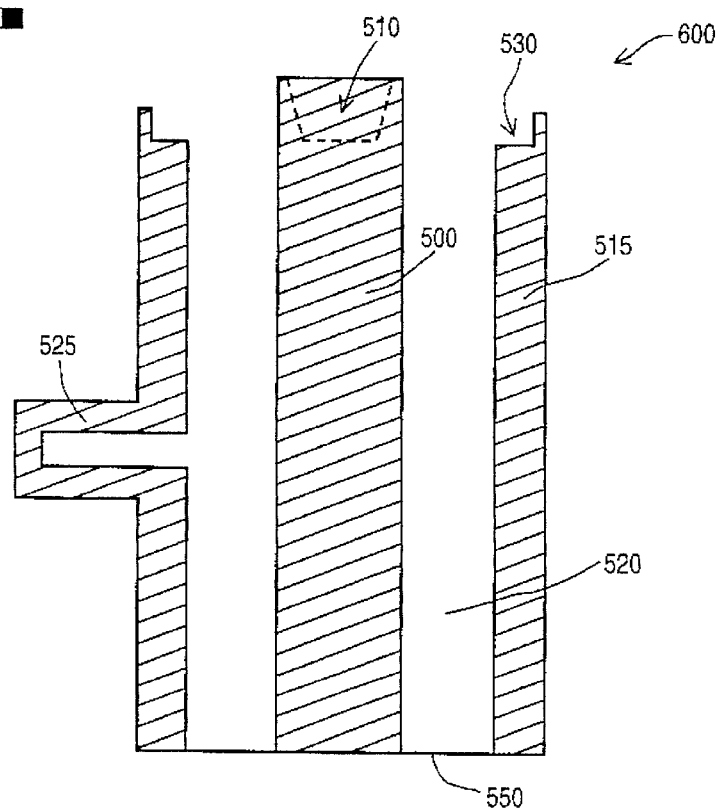
FIG_5
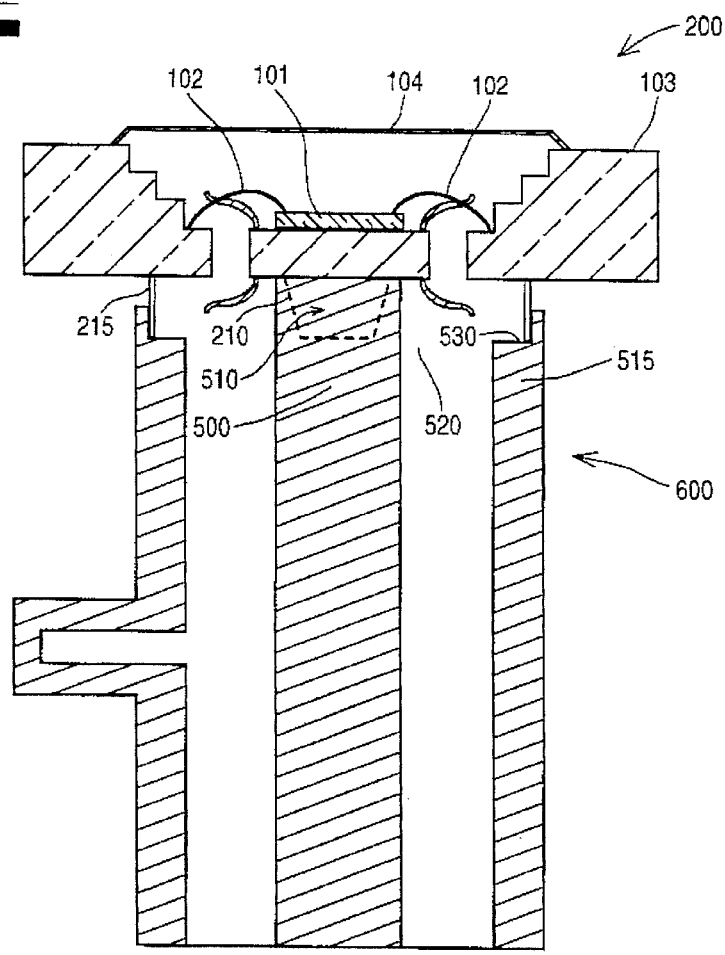
FIG_6

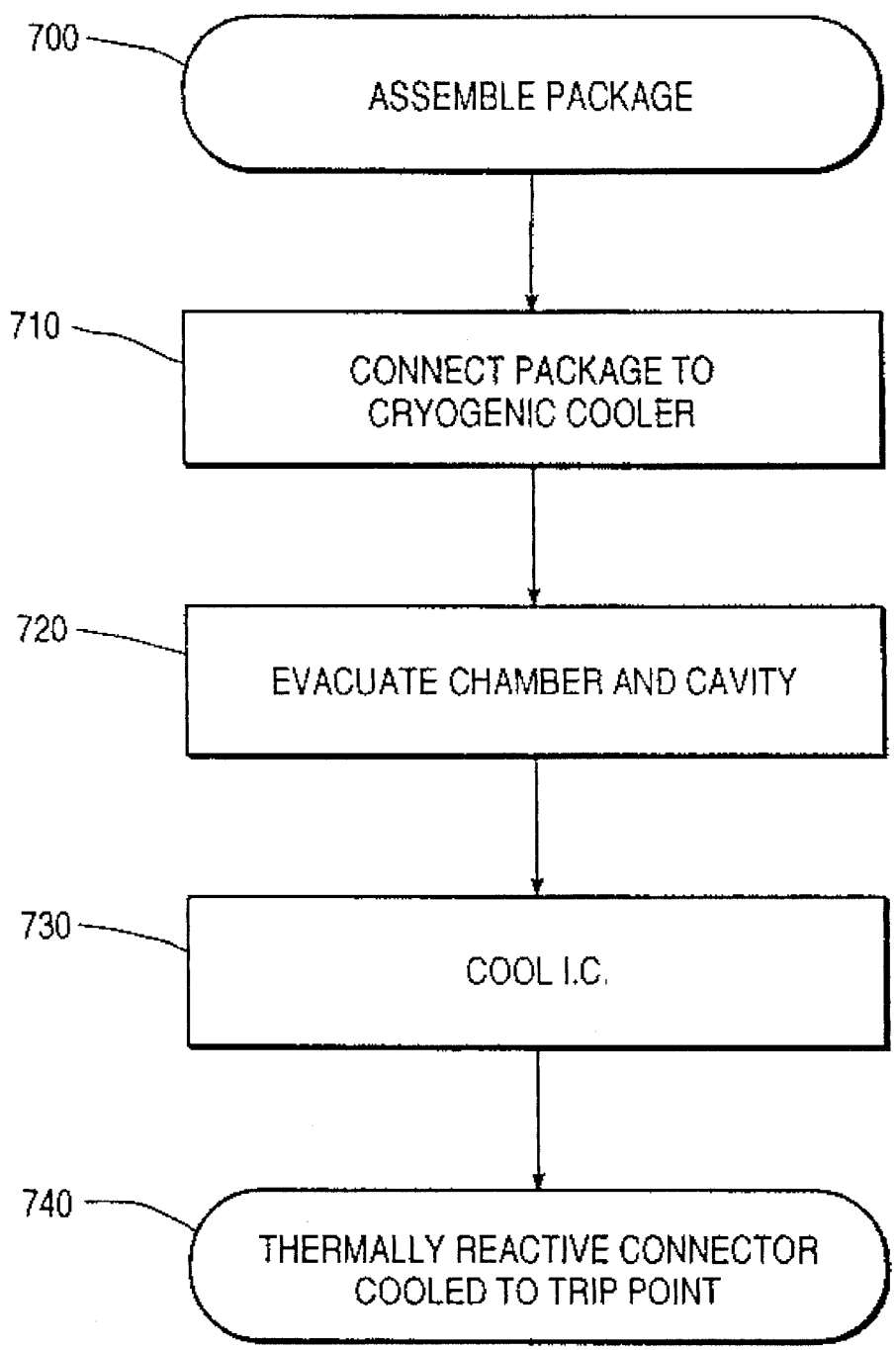
FIG_7

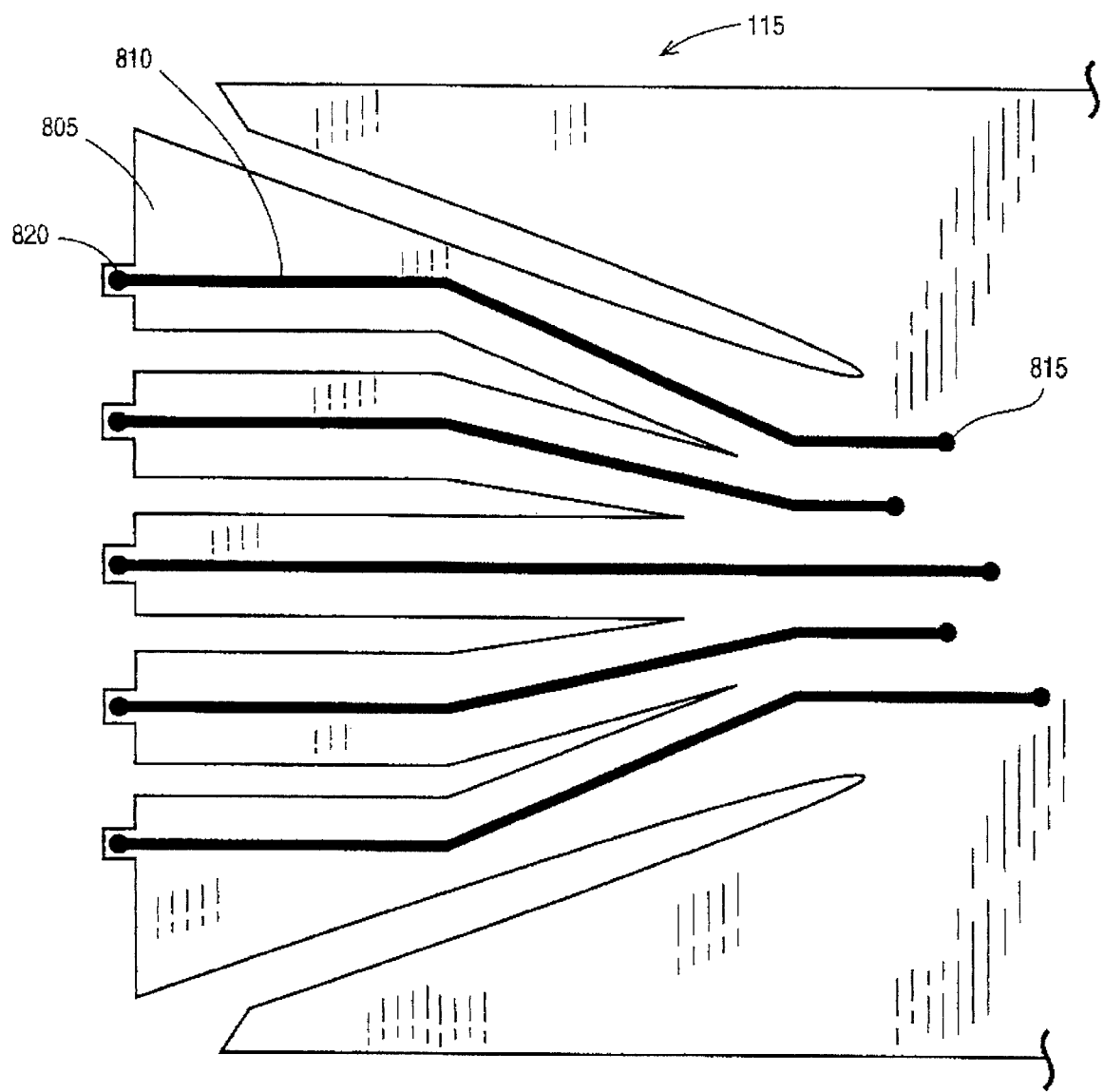
FIG_8

LOW HEAT LOSS AND SECURE CHIP CARRIER FOR CRYOGENIC COOLING

BACKGROUND OF THE INVENTION

1. Field of the Invention

The present invention relates generally to an integrated circuit (IC) package for enclosing an IC and, more particularly, to an IC package having a secure chip carrier for cryogenic cooling of the IC chip.

2. Art Background

Techniques for using cryogenic coolants such as liquid helium for reducing the operating temperature of an integrated circuit (IC) are well known in the prior art. One method for cryogenic cooling requires the use of a cold probe having a length of thermally conductive material. The cold probe includes a base end that is connected to a cryogenic cooling plant within which a cryogenic coolant is disposed and circulated. The cold probe also includes a contact end which is typically connected directly to the die of the IC via a tight thermal joint. As the base end of the cold probe is in direct contact with the cryogenic coolant, the temperatures of the cold probe and the die are reduced to approximately the temperature of the cryogenic coolant. Cryogenic cooling typically enhances the performance of the cooled IC.

FIG. 1 shows a typical prior art IC package design in which an IC 101 is epoxied to the substrate 103 of the IC package 100. Bond wires 102 are coupled between the IC and conductors disposed in the substrate 103. These conductors lead to the I/O pins 105. Lid 104 covers the cavity in which the IC 101 is placed. The flow arrows 106 illustrate thermal paths from the IC 101. The flow arrows 106 are shown to be directed from the IC package 100 and flowing to the ambient air outside of the package 100. This happens, for example, when the operating temperature of the IC 101 is greater than the ambient temperature of the atmosphere outside of the IC package 100. When the operating temperature of the IC 101 is greater than the ambient temperature of the air, it is desirable to have as many thermal paths away from the IC 101 as possible such that sufficient heat transfer may take place.

For cryogenic cooling of the IC 101, the package design of the IC package 100 is typically not altered in any substantial way. For example, the cold probe is often connected to the top surface of the die of IC 101, wherein the bottom surface of the IC 101 remains connected to the substrate 103. Unfortunately, the thermal paths through the IC package 100 become a liability during cooling because the direction of heat transfer reverses, and, unless the thermal load of the IC 101 is isolated from the ambient air, the cryogenic cooling plant will be forced to cool the ambient air.

The prior art discloses that an efficient method for isolating the IC 101 from the ambient air is to create a vacuum between the IC 101 and the ambient air. However, a typical prior art method for creating a vacuum requires surrounding the entire IC package 100 with an evacuated chamber. This solution requires a large amount of board space in a computer system and may significantly increase the footprint of the system. A further disadvantage of the prior art method is that permanent attachment of the cold probe to the die of the IC results in waste if either of the cold probe and the IC fails while the other continues to be operable.

As will be described, the present application discloses an integrated circuit package having a reduced number of thermal paths to an integrated circuit during the cryogenic cooling of the integrated circuit. The integrated circuit package of the present invention achieves isolation of the integrated circuit by creating a vacuum within the integrated circuit package itself.

SUMMARY OF THE INVENTION

An integrated circuit package is disclosed. The integrated circuit package includes a substrate having a cavity formed therein for enclosing an integrated circuit. The integrated circuit package also includes a carrier for holding the integrated circuit. The carrier is positioned within the cavity of the substrate. A thermally reactive connector is coupled to the carrier. The thermally reactive connector is for selectively coupling the carrier to the substrate when a temperature of the thermally reactive connector is above a first temperature such that the carrier is held in position within the opening. The thermally reactive connector is also for decoupling the carrier from the substrate when the carrier temperature is at the first temperature. In this manner, the number of thermal paths between the integrated circuit and the substrate of the integrated circuit is reduced.

In another embodiment, the integrated circuit package includes a connector coupled to the carrier. A cooling apparatus is provided for detachable connection to the connector. The cooling apparatus includes an outer wall that is disengageably attached to the integrated circuit package such that an airtight seal is formed between the outer wall and the integrated circuit package when the outer wall is attached to the integrated circuit package. The cooling apparatus also includes a cold probe disposed within the outer wall such that a chamber is formed between the outer wall and the cold probe. The cold probe is disengageably attached to the carrier. The cold probe is for cooling the carrier to a first temperature when the cold probe is attached to the carrier. Evacuation of the chamber results in evacuation of the cavity. In this manner, isolation of the integrated circuit is achieved without bulky enclosures and the cryogenic cooling apparatus and integrated circuit are not permanently attached.

BRIEF DESCRIPTION OF THE DRAWINGS

The objects, features, and advantages of the method and apparatus of the present invention will be apparent from the following detailed description of the invention in which:

FIG. 1 shows a prior art integrated circuit package.

FIG. 2A shows an integrated circuit package according to one embodiment.

FIG. 2B shows an integrated circuit package according to another embodiment.

FIG. 3A is a top view of an integrated circuit package.

FIG. 3B is a bottom view of an integrated circuit package.

FIG. 4 shows the connection between the carrier and the substrate of an integrated circuit package.

FIG. 5 shows a cooling apparatus according to one embodiment.

FIG. 6 shows a cooling system according to another embodiment.

FIG. 7 is a flow chart illustrating a method according to one embodiment.

FIG. 8 shows a flexible circuit.

DETAILED DESCRIPTION

In the description that follows there are disclosed a number of specific details and examples. These details and examples, as well as the details and examples illustrated in the accompanying figures, are provided to illustrate the operation of the various embodiments of the present invention. Accordingly, it will be understood that these details and examples are not exhaustive of the number of ways in which the present invention may be practiced.

FIG. 2A illustrates an integrated circuit package according to one embodiment. The IC package 200 includes substrate 103, lid 104, thermally reactive connectors 207, carrier 205, connector 210, and chamber interface 215. As shown, the IC 101 is placed on carrier 205, which acts as a platform for supporting the IC 101. Although the IC package 200 is shown as receiving the IC 101, the IC package 200 may be modified to receive a multi-chip module comprised of a number of ICs. Attachment of the IC 101 to the carrier 205 may be accomplished, for example, by the use of epoxy or any other equivalent bonding agent. The carrier 205 is preferably manufactured from a thermally conductive material such as copper to provide a minimal thermal resistance between the IC 101 and a cold probe (not shown). Although the carrier 205 is shown as having the same thickness as the thinnest portion of the substrate 103, the thickness of the carrier 205 may be reduced to minimize thermal overhead.

Thermally reactive connectors 207 are attached to the carrier 205. The thermally reactive connectors 207 are preferably manufactured of lengths of bimetallic material, memory metal, or of any other thermally conductive material that changes states when a trip-point temperature is reached. The thermally reactive connectors 207 are shown as extending across air gaps between the carrier 205 and the substrate 103. When the temperature of the carrier 205 is above the trip-point temperature for the thermally reactive connectors 207, flexure in the thermally reactive connectors applies force to the substrate 103 such that the carrier 205 is held in place. Thus, in an ambient state, the thermally reactive connectors 207 act as clips for holding the carrier 205 in place. When the carrier temperature drops to the trip-point temperature, the thermally reactive connectors 207 change state such that substantially no force is applied to the substrate 103 and the carrier 205 is decoupled from the substrate 103 such that the thermal paths between the substrate 103 and the IC 101 are limited to those thermal paths created by the bond wires 102. Thus, in a cooled state, the thermally reactive connectors 207 are not in contact with substrate 103. This significantly reduces the number of thermal paths between the ambient and the IC 101. The trip-point temperature for the thermally reactive connectors 207 is preferably chosen to be between an ambient temperature and the minimum temperature achievable by cryogenic cooling.

Bimetallic materials are typically manufactured of two metals having different rates of thermal expansion. When the bimetallic material is heated or cooled to a trip-point temperature the different rates of thermal expansion results in tension between the two metals causing the bimetallic element to assume a second shape. In this case, when the temperature of the carrier is above a trip-point temperature, the bimetallic elements are each compressively connected to the substrate 103. But when the carrier temperature drops to the trip-point temperature, the bimetallic element curves back away from the substrate such that the only connection between the substrate 103 and the IC 101 are the bond wires 102. Memory metal behaves similarly.

The design of IC package 200 provides for the detachable connection of a cold probe (not shown) to the IC package 200. Connector 210 is attached to carrier 205 and is preferably manufactured of the same thermally conductive material as carrier 205. Alternatively, the carrier 205 and connector 210 may be integrally formed of a single piece of thermally conductive material. For this embodiment, the connector 210 is shown as a truncated cone that tapers as it extends downwardly from bottom surface of the carrier 205. The cold probe (not shown) is designed to receive the connector 210 in a male-female connection. As will be discussed below, the cold probe provides support for the carrier 205 when the thermally reactive connectors 207 are detached from the substrate 103.

Lid 104 is attached to substrate 103 to provide an air-tight seal for the cavity formed in the substrate 103. The lid 104 is preferably put in place after the carrier 205 is clipped to the substrate 103 using the thermally reactive connectors 207 and after the bond wires 102 have been attached. In this manner, the only manner in which gases may enter and exit the cavity of substrate 103 is via the air gaps formed between the carrier 205 and the substrate 103. Chamber interface 215 is designed to form an air-tight seal with the outer wall of a cooling apparatus (not shown). The outer wall encloses the cold probe, and an annular chamber is formed between the cold probe and the outer wall. This annular chamber is in communication with the cavity of substrate 103 such that evacuation of the chamber results in evacuation of the cavity. Thus, the thermal load of IC 101 can be isolated from the ambient without using a bulky enclosure to enclose the entire IC package 200.

FIG. 2B shows an alternative IC package 200 that uses a flexible circuit 115 in place of the bond wires 102 for connecting the IC 101 to the I/O pins 105. At high frequencies of operation, bond wires 102 manufactured of gold or a similar conductor can act as inductors, reducing the integrity of the signals as they are transmitted from the IC 101 to the I/O pins 105. To reduce the inductive effects of the bond wires, the flexible circuit 115 is used. The flexible circuit 115 includes a flexible material such as KAPTON™ upon which traces of conductive material are deposited. The flexible circuit 115 is placed in direct contact with the IC 101, and the length of the path between the IC 101 and I/O pins 105 is reduced, which reduces the amount of inductance associated with each electrical connection. Wherein the electrical connection is improved, care must be taken to ensure that the parasitic thermal losses associated with the electrical connection are not unnecessarily increased. Therefore, the amount of flexible material should be minimized to reduce the thermal paths between the IC 101 and the I/O pins 105. The flexible circuit 115 is discussed in more detail with respect to FIG. 8, below.

FIG. 3A shows a top view of IC package 200. The bond wires 102 are shown as extending from the IC 101, across the air gaps surrounding IC 101 and to the substrate 103. The carrier 205 is shown as being rectangular in shape, but may be any shape sufficient to contact all of the bottom surface of the IC 101. The substrate 103 has a rectangular hole to provide for placement of the carrier 205 within the rectangular hole. Thus, the air gap between the carrier 205 and the substrate 103 is also rectangular. As shown, each thermally reactive connector 207 extends from a corner of he carrier 205, diagonally across the air gap and to an interior corner of the of the substrate 103 formed by the rectangular hole.

FIG. 3B shows a bottom view of IC package 200. The chamber interface 215 is shown as being annular in shape, but any shape of the chamber interface sufficient to enclose the air gaps formed between the substrate 103 and the carrier 205 may be alternatively employed. Connector 210 is clearly shown as having a circular cross-section. Thermally reactive connectors 207 are shown as extending from the bottom of carrier 205 and in positions substantially parallel to corresponding thermally reactive connectors attached to the top of carrier 205. In this manner, force is applied between each corresponding top and bottom thermally reactive connectors 207 such that each pair of thermally reactive connectors 207 acts as a clip.

FIG. 4 more clearly shows the thermally reactive carriers 207. The solid lines for the thermally reactive connectors 207 correspond to the ambient state when the thermally reactive connectors act as clips. The dashed lines correspond to the cooled state when the thermally reactive connectors are detached from the substrate 103.

It is important that good thermal connections are provided between the carrier 205 and the IC 101, between the carrier 205 and the connector 210, and between the carrier 205 and the thermally reactive connectors 207. A good thermal connection between the carrier 205 and the IC 101 ensures proper cooling of the IC 101. Good thermal connections between the carrier 205 and the connector 210 and between the carrier 205 and thermally reactive connectors 207 ensure a more rapid cooling of the carrier 205 such that the thermally reactive connectors enter the cooled state more rapidly. Thus, the IC 101 is preferably epoxied to the carrier 205, the carrier 205 is preferably soldered or integrally formed with the connector 210, and the thermally reactive connectors 207 are preferably soldered to the carrier 205.

FIG. 5 is shows a cryogenic cooling apparatus 600 according to one embodiment. Shown therein is cold probe 500, which is a solid cylindrical piece of thermally conductive material. A portion of the thermally conductive material is removed from the tip of the cold probe in order to provide a receptacle 510 for receiving the connector 210 of the IC package 200. The interface between the cold probe and the connector 210 may be any equivalent interconnection type. The cold probe 500 and the connector 210 are preferably manufactured of thermally conductive materials having different coefficients of thermal expansion such that a tight thermal joint is created between the connector 210 and the receptacle 510 when cooling occurs. When the connector 210 and receptacle 510 are heated to the ambient temperature, the connector 210 may be easily detached from the cold probe. Thus, the unnecessary waste of operative components can be avoided should only the cryogenic cooling apparatus 600 or the IC 101 fail. The operative component may be recycled in another similar cryogenic cooling system. To achieve this thermally variable joint, the connector 210 may be manufactured of ALLOY 49™, and the cold probe 500 may be manufactured of copper.

Disposed around the cold probe 500 is a cylindrical outer wall 515. An annular chamber 520 is created between the outer wall 515 and the cold probe 500. The bottom wall 550 seals the bottom of the chamber. A pinch tube 525 is provided for creating a vacuum once the cooling apparatus is coupled to the IC package 200. The upper portion of the outer wall is provided with a ledge 530 for receiving the chamber interface 215 (see FIGS. 2A and 2B) such that an air tight seal is formed when the IC package 200 is connected to the cooling apparatus 600. The cooling of the cold probe 500 is provided by cryogenic engine (not shown) which is attached to the cold probe via the bottom of the chamber.

FIG. 6 shows a cooling system according to one embodiment. The IC package 200 is shown as being connected to cryogenic cooling apparatus 600. The chamber interface 215 rests on the ledge 530 such that an air-tight seal is formed between the IC package 200 and the cryogenic cooling apparatus 600. The connector 210 is received within the receptacle 510 of the cold probe 500. The annular chamber 520 and the cavity of substrate 103 have been evacuated and the pinch tube 525 has sealed the chamber. Thus, a passive vacuum is created. Alternatively, an active vacuum may be maintained to isolate the thermal load of the IC 101.

The temperature of cold probe 500, IC 101, carrier 205 and thermally reactive connectors 207 is been reduced such that the thermally reactive connectors 207 are detached from the substrate 103. The IC 101 is thus isolated from the ambient by a vacuum created within the IC package 207. The number of thermal paths between the substrate 103 and the IC 101 are also significantly reduced.

FIG. 7 is a flow chart showing a method of one embodiment. At step 700, an IC package as described in FIGS. 2-4 is assembled. At step 710, the IC package is coupled to the cryogenic cooling apparatus described in FIG. 5. At step 720, the chamber and cavity are evacuated to isolate the IC from the ambient air outside of the IC package. The IC is cooled via the cold probe at step 730 until the temperature of the carrier and thermally reactive connectors is reduced to the trip-point temperature at step 740.

FIG. 8 shows the flexible circuit 115 of FIG. 2B in greater detail. The flexible circuit 115 includes a flexible material 805 upon which traces 810 of conductive material are deposited. A first end of each trace 810 terminates at a center face of flexible circuit 115. A solder bump 815 is placed at the first end of each trace 810 to attach the center face of the flexible circuit 115 to the IC 101 (as shown in FIG. 2B). A second end of each trace 810 terminates at the outer perimeter of the flexible circuit 115. A solder bump 820 or similar attachment device is deposited at the second end of each trace 810 for attachment to bond pads of the substrate 103 (as shown in FIG. 2B). The bond pads of the substrate 103 are directly connected to the I/O pins 105 (not shown). The traces 810 thus provide an electrical connection between the IC 101 and the I/O pins 105 using a reduced amount of condutive material over the bond wires 102.

As shown, there are slots cut into the flexible circuit 115 to reduce the total amount of flexible material 805. This reduces the thermal paths between the IC 101 and the substrate 103. Further, the slots allow the vacuum to surround the IC 101. Slots and vents in the flexible material may be of any size, shape, or orientation so long as the slots and vents do not degrade the electrical connection.

In the foregoing specification the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than restrictive sense.

What is claimed is:

1. An integrated circuit package, the integrated circuit package comprising:

a substrate having a cavity formed therein;

a carrier for holding an integrated circuit within the cavity of the substrate; and a thermally reactive connector means coupled to the carrier, the thermally reactive connector means for selectively coupling the carrier to the substrate in response to a temperature of the thermally reactive connector.

2. The integrated circuit package of claim 1, wherein the carrier comprises:

a platform having a top face and a bottom face, the top face for supporting the integrated circuit; and a connector having a first end attached to the bottom face and a second end for coupling to a cooling apparatus, wherein the cooling apparatus is for cooling the carrier and for holding the carrier in position within the opening when the carrier is decoupled from the substrate.

3. The integrated circuit package of claim 2, wherein the thermally reactive connector comprises:

a first bimetallic element having a first end attached to the top face of the carrier and a second end, the first bimetallic element having a first curvature when the temperature of the thermally reactive connector is above a first temperature such that the second end is coupled to the substrate, the first bimetallic element having a second curvature when the temperature of the thermally reactive connector is equal to or less than the first temperature such that the second end is decoupled from the substrate; and a second bimetallic element having a third end attached to the bottom face of the carrier and a fourth end, the second bimetallic element having a third curvature when the temperature of the thermally reactive connector is above the first temperature such that the fourth end is coupled to the substrate, the second bimetallic element having a fourth curvature when the temperature of the thermally reactive connector is equal to or less than the first temperature such that the fourth end is decoupled from the substrate, the first curvature and the third curvature being such that the first and second bimetallic elements apply pressure to the substrate.

4. The integrated circuit package of claim 2, wherein the thermally reactive connector comprises:

a first memory metal element having a first end attached to the top face of the carrier and a second end, the first memory metal element having a first curvature when the temperature of the thermally reactive connector is above a first temperature such that the second end is coupled to the substrate, the first memory metal element having a second curvature when the temperature of the thermally reactive connector is equal to or less than the first temperature such that the second end is decoupled from the substrate; and a second memory metal element having a third end attached to the bottom face of the carrier and a fourth end, the second memory metal element having a third curvature when the temperature of the thermally reactive connector is above the first temperature such that the fourth end is coupled to the substrate, the second memory metal element having a fourth curvature when the temperature of the thermally reactive connector is equal to or less than the first temperature such that the fourth end is decoupled from the substrate, the first curvature and the third curvature being such that the first and second memory metal elements apply pressure to the substrate.

5. An apparatus for cryogenic cooling of an integrated circuit, the apparatus comprising:

an integrated circuit package comprising:
a substrate having a cavity formed therein;
a carrier for holding the integrated circuit within the cavity of the substrate;
a thermally reactive connector coupled to the carrier, the thermally reactive connector for selectively coupling the carrier to the substrate in response to a temperature of the thermally reactive connector;

a cooling apparatus including:
an outer wall that is disengageably attached to the integrated circuit package such that an airtight seal is formed between the outer wall and the integrated circuit package when the outer wall is attached to the integrated circuit package;
a cold probe disposed within the outer wall such that a chamber is formed between the outer wall and the cold probe, the cold probe being disengageably attached to the carrier, the cold probe for cooling the carrier when the cold probe is attached to the carrier.

6. The apparatus of claim 5, wherein the carrier comprises:

a top face for supporting the integrated circuit;

a bottom face, and a connector having a first end attached to the bottom face and a second end for coupling to the cold probe.

7. The apparatus of claim 6, wherein the thermally reactive connector comprises:

a first bimetallic element having a first end attached to the top face of the carrier and a second end, the first bimetallic element having a first curvature when the temperature of the thermally reactive connector is above a first temperature such that the second end is coupled to the substrate, the first bimetallic element having a second curvature when the temperature of the thermally reactive connector is equal to or less than the first temperature such that the second end is decoupled from the substrate; and a second bimetallic element having a third end attached to the bottom face of the carrier and a fourth end, the second bimetallic element having a third curvature when the temperature of the thermally reactive connector is above the first temperature such that the fourth end is coupled to the substrate, the second bimetallic element having a fourth curvature when the temperature of the thermally reactive connector is equal to or less than the first temperature such that the fourth end is decoupled from the substrate, the first curvature and the third curvature being such that the first and second bimetallic elements apply pressure to the substrate.

8. The apparatus of claim 6, wherein the thermally reactive connector comprises:

a first memory metal element having a first end attached to the top face of the carrier and a second end, the first memory metal element having a first curvature when the temperature of the thermally reactive connector is above a first temperature such that the second end is coupled to the substrate, the first memory metal element having a second curvature when the temperature of the thermally reactive connector is equal to or less than the first temperature such that the second end is decoupled from the substrate; and a second memory metal element having a third end attached to the bottom face of the carrier and a fourth end, the second memory metal element having a third curvature when the temperature of the thermally reactive connector is above the first temperature such that the fourth end is coupled to the substrate, the second memory metal element having a fourth curvature when the temperature of the thermally reactive connector is equal to or less than the first temperature such that the fourth end is decoupled from the substrate, the first curvature and the third curvature being such that the first and second memory metal elements apply pressure to the substrate.

9. The apparatus of claim 6, wherein the cold probe comprises:

a thermally conductive shaft having a first end coupled to a cryogenic coolant and a second end for coupling to the connector, the second end including an aperture for receiving the connector.

10. The apparatus of claim 9, wherein the cold probe is manufactured of a first material having a first coefficient of thermal expansion and the connector is manufactured of a second material having a second coefficient of thermal expansion that differs from the first coefficient of thermal expansion such that the cold probe is compressively attached to the connector when the carrier is cooled to the first temperature.

11. The apparatus of claim 6, wherein connector includes an aperture for receiving the cold probe, the cold probe comprising:

a thermally conductive shaft having a first end coupled to a cryogenic coolant and a second end for coupling to the connector, the second end including a male connector for insertion into the aperture.

12. The apparatus of claim 11, wherein the cold probe is manufactured of a first material having a first coefficient of thermal expansion and the connector is manufactured of a second material having a second coefficient of thermal expansion that differs from the first coefficient of thermal expansion such that the cold probe is compressively attached to the connector when the carrier is cooled to the first temperature.

13. An integrated circuit package, the integrated circuit package comprising:

a substrate having a cavity formed therein;

a carrier for holding an integrated circuit within the cavity of the substrate; and a connector manufactured of a thermally reactive material that switches between two states in response to the temperature of the connector such that the connector couples the carrier to the substrate when the thermally reactive material is in a first state and decouples the carrier from the substrate when the thermally reactive material is in a second state.

* * * * *